United States Patent [19]

Kim

[11] Patent Number: 5,490,901
[45] Date of Patent: Feb. 13, 1996

[54] METHOD FOR FORMING A CONTACT HOLE IN A SEMICONDUCTOR DEVICE

[75] Inventor: Heon D. Kim, Bubaleub, Rep. of Korea

[73] Assignee: Hyundai Electronics Industries Co., Ltd., Rep. of Korea

[21] Appl. No.: 213,168

[22] Filed: Mar. 15, 1994

[30] Foreign Application Priority Data

Mar. 15, 1993 [KR] Rep. of Korea .................. 1993-3949

[51] Int. Cl.⁶ .................................................. B44C 1/22
[52] U.S. Cl. .................... 156/643.1; 437/189; 437/195
[58] Field of Search ................................. 156/643, 644; 437/195, 981, 982, 189

[56] References Cited

U.S. PATENT DOCUMENTS

| 5,022,958 | 6/1991 | Favreau | 156/643 |
| 5,223,084 | 6/1993 | Uesato | 437/981 |
| 5,227,013 | 7/1993 | Kumar | 156/644 |

FOREIGN PATENT DOCUMENTS

| 0031523 | 2/1983 | Japan | 437/981 |
| 0140720 | 7/1985 | Japan | 437/947 |

OTHER PUBLICATIONS

Wolf, "Silicon Processing for the VLSI Era" vol. 1–2, Lattice Press, 1990, pp. 529, 534, 539, 551–552–vol. 1, pp. 188–189–vol. 2.

*Primary Examiner*—R. Bruce Breneman
*Assistant Examiner*—Joni Chang
*Attorney, Agent, or Firm*—Merchant, Gould, Smith, Edell, Welter & Schmidt

[57] ABSTRACT

A method for forming a contact hole in a semiconductor device, capable of obtaining a good step coverage in formation of metal wiring and contacts of a highly integrated circuit exhibiting a high topology. The method comprises a primary etching step including the steps of forming a first mask pattern on an insulating film and etching the insulating film by use of the first mask pattern such that a possibly largest area of the insulating film is etched in so far as conduction layers present in the insulating film are not exposed, thereby reducing a topology at an upper portion of the contact region, and a secondary etching step including the steps of removing the first mask pattern, forming a second mask pattern for exposing the contact region, and etching the insulating film remaining over the contact region by use of the second mask, thereby forming a contact hole.

5 Claims, 3 Drawing Sheets

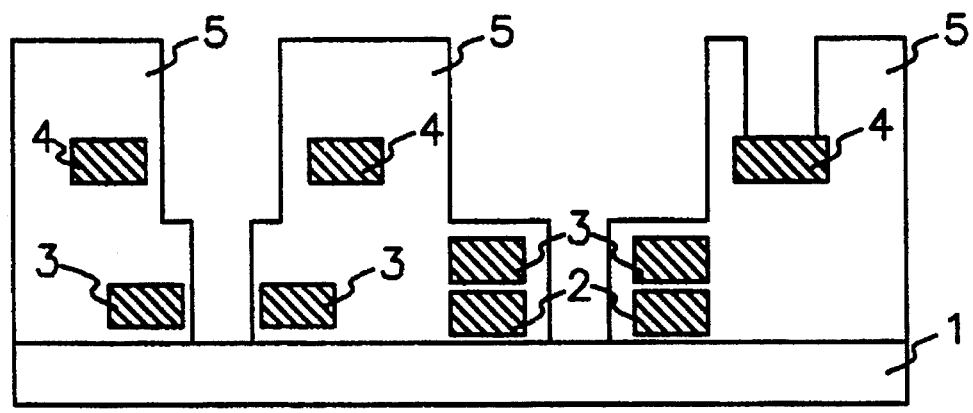
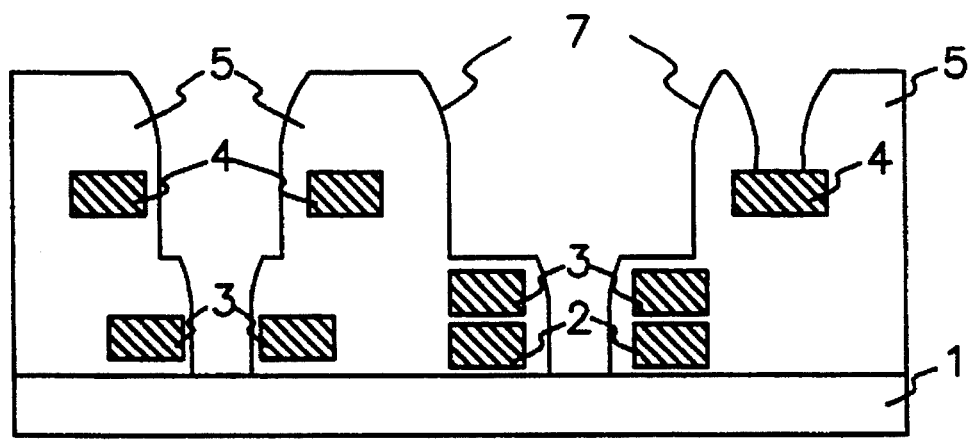
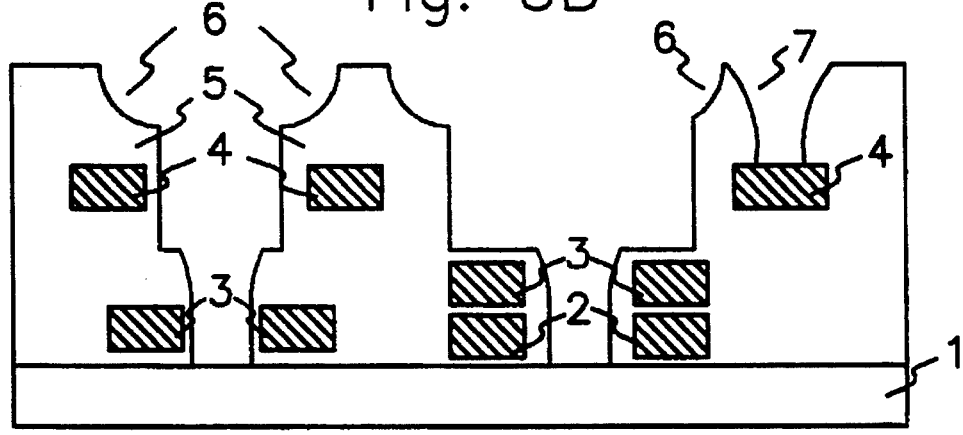

5,490,901

METHOD FOR FORMING A CONTACT HOLE IN A SEMICONDUCTOR DEVICE

BACKGROUND OF THE INVENTION

1. Field of the Invention

The present invention relates to a method for forming contacts in a semiconductor device.

2. Description of the Prior Art

For obtaining a higher integration degree in a semiconductor device, contact holes formed to be in contact with a semiconductor substrate or a conduction layer have a reduced dimension. The increase in integration degree results in a great increase in topology.

Referring to FIGS. 1A to 1C, a conventional method for forming contacts is illustrated.

In accordance with this method, conduction layers 2, 3 and 4 are sequentially formed, in this order, on a silicon substrate 1, as shown in FIG. 1A. The conduction layers 2, 3 and 4 are insulated from one another by an insulating film 5. Thereafter, the insulating film 5 is then etched using a mask pattern formed on the insulating film 5 such that the silicon substrate 1 is partially exposed, thereby forming contact holes. Subsequently, a deposition material is deposited in the contact holes, thereby forming contacts.

Various methods may be used for formation of contact holes achieved by etching the insulating film 5.

For example, a method may be used which involves two etching steps one being a wet etching and the other being a dry etching. By the combination of the wet etching and the dry etching used in formation of contact holes as shown in FIG. 1B, the upper portion of each contact hole is etched to have a wine glass shape and, thus, an increased width. Thereafter, a treatment for providing a good step coverage of the conduction material is carried out. As the treatment for providing the good step coverage, a dry etching process may be used upon etching the insulating film 5 to form contact holes as shown in FIG. 1C. By this dry etching process, the upper portion of each contact hole has an increased width. In FIGS. 1B and 1C, the reference numeral 6 denotes contact hole portions subjected to the wet etching whereas the reference numeral 7 denotes contact hole portions subjected to the slant dry etching.

However, such conventional methods for forming contact holes by using the combination of a wet etching and a dry etching and by using a dry etching have a problem of a poor step coverage caused by a high topology between the upper and lower portions of each contact hole formed. Due to such a poor step coverage, the resistance of the contact material may be adversely increased. In a severe case, a short circuit may occur.

SUMMARY OF THE INVENTION

Therefore, an object of the invention is to provide a method for forming contact holes in a semiconductor device, capable of obtaining a good step coverage in formation of metal wiring and contacts of a highly integrated circuit exhibiting a high topology, thereby avoiding an increase in resistance of contact material and an occurrence of short circuit.

In accordance with the present invention, this object can be accomplished by providing a method for forming a contact hole in a semiconductor device by exposing a contact region covered with an insulating film, comprising: a primary etching step including the steps of forming a first mask pattern on said insulating film and etching the insulating film by use of said first mask pattern such that a possibly largest area of the insulating film is etched in so far as conduction layers present in the insulating film are not exposed, thereby reducing a topology at an upper portion of said contact region; and a secondary etching step including the steps of removing the first mask pattern, forming a second mask pattern for exposing the contact region, and etching the insulating film remaining over the contact region by use of said second mask, thereby forming a contact hole.

BRIEF DESCRIPTION OF THE DRAWINGS

Other objects and aspects of the invention will become apparent from the following description of embodiments with reference to the accompanying drawings in which:

FIGS. 1A to 1C are sectional views respectively illustrating a conventional method for forming contact holes, wherein FIG. 1A shows a structure obtained after formation of contact holes, FIG. 1B shows contact holes formed by use of a wet-etching process, and FIG. 1C shows contact holes formed by use of a slant dry-etching process;

FIGS. 2A to 2C are sectional views respectively illustrating a method for forming contact holes in accordance with the present invention, wherein FIG. 2A shows a primary etching step by which an insulating film is partially etched, FIG. 2B shows a secondary etching step by which the insulating film remaining after completion of the etching step of FIG. 2A is etched to form contact holes, and FIG. 2C shows the contact holes each having a wide upper portion;

FIG. 3A is a sectional view of a contact hole structure obtained in a case wherein both of the etching steps shown in FIGS. 2A and 2B are carried out by use of a slant dry-etching process; and FIG. 3B is a sectional view of a contact hole structure obtained in a case wherein both of the etching steps shown in FIGS. 2A and 2B are carried out by use of a wet-etching process.

DETAILED DESCRIPTION OF THE PREFERRED EMBODIMENTS

Figure 1A:
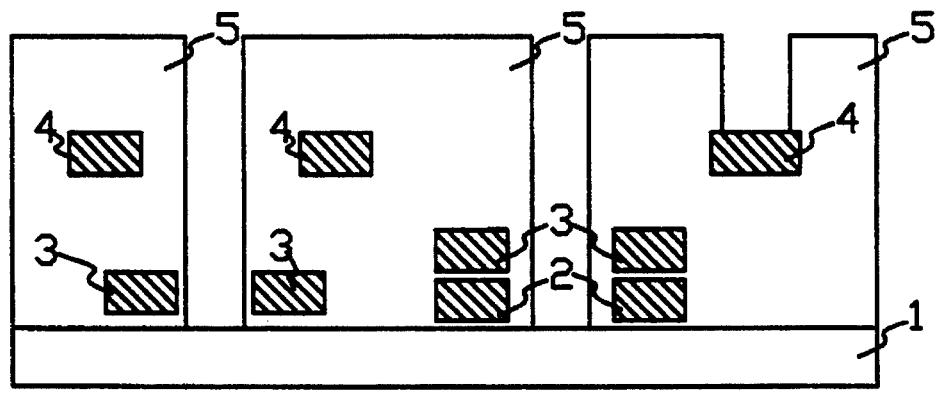
Figure 1B:
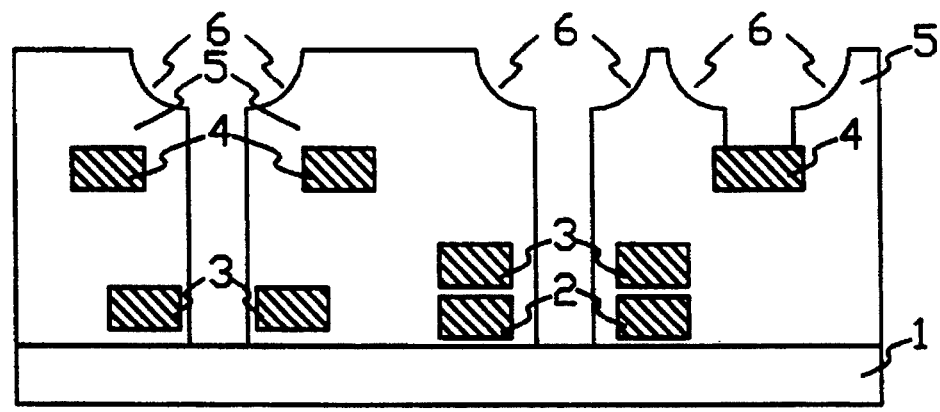
Figure 1C:
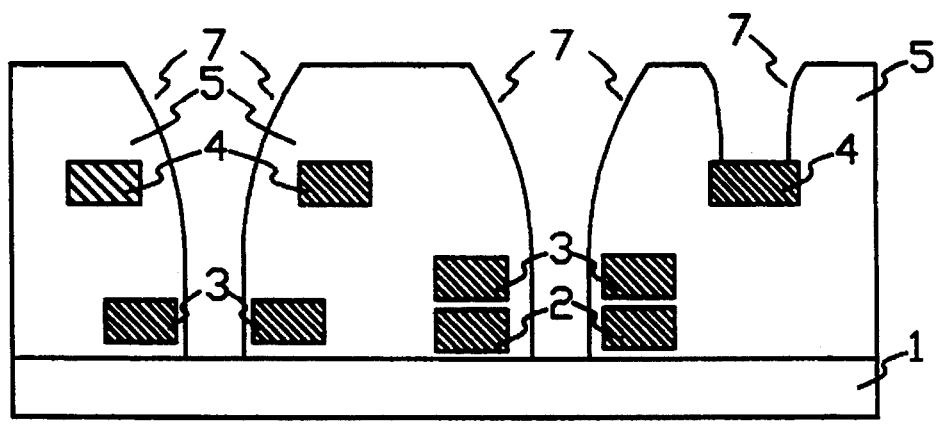
Figure 2A:
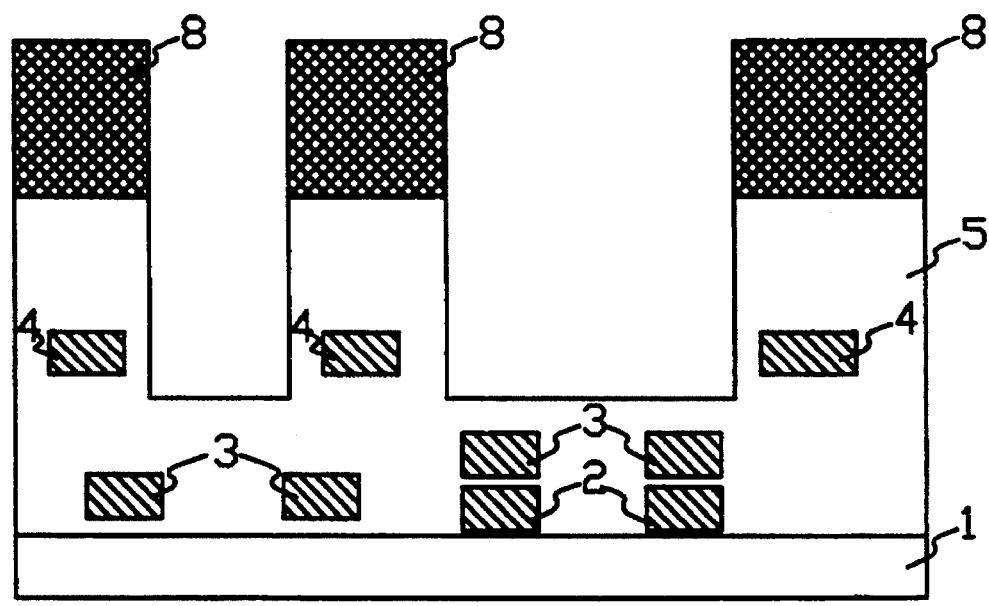
Figure 2B:
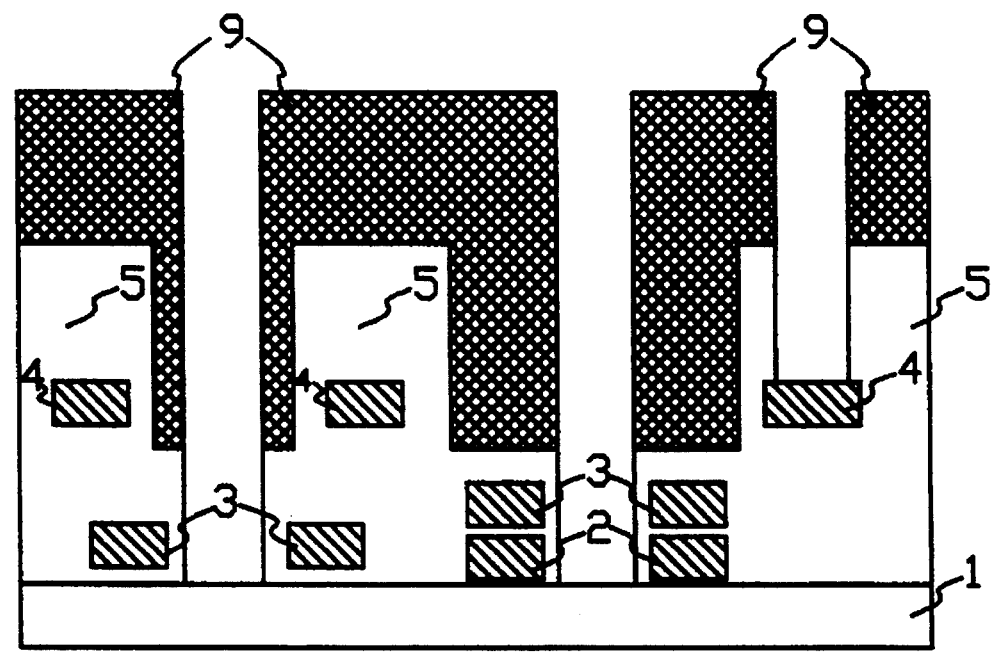

FIGS. 2A to 2C are sectional views respectively illustrating a method for forming contact holes in accordance with the present invention.

In accordance with the method of the present invention, conduction layers 2, 3 and 4 are sequentially formed, in this order, on a silicon substrate 1, as shown in FIG. 2A. The conduction layers 2, 3 and 4 are insulated from one another by an insulating film 5. Thereafter, a photoresist pattern 8 is formed over the insulating film having a previously planarized upper surface. Using the photoresist pattern 8 as a mask, the insulating film 5 is then selectively subjected to the vertical etching such that the uppermost conduction layer 4 is not exposed.

Subsequently, another photoresist film 9 for removal of the remaining insulating film 5 is formed on the resulting structure, as shown in FIG. 2B. Using the photoresist film 9 as a mask, the remaining insulating film 5 is then selectively subjected to the vertical etching such that respective predetermined portions of the uppermost layer 4 and the silicon substrate 1 are exposed. Where the insulating film 5 is comprised of an ion-implanted borophosphosilicate glass film or an ion-implanted phosphosilicate glass film, it may be subjected to an annealing so that its topology can be decreased.

Then, the photoresist pattern 9 is removed. Thus, contact holes each having a very wide upper portion are formed. This will be apparent by referring to FIG. 2C.

Where various known etching processes are used in combination with the vertical dry etching processes described in conjunction with FIGS. 2A and 2B in accordance with the method of the present invention wherein contact holes are formed by the double etching, a better step coverage can be obtained.

This will be described in conjunction with FIGS. 3A and 3B.

FIG. 3A shows a case wherein two steps for slantly dry-etching the insulating film 9 are used as the etching steps of FIGS. 2A and 2B so as to obtain an increased width of the upper portion of each contact hole finally formed. On the other hand, FIG. 3B shows a case wherein a step for wet-etching the insulating film 9 is used as the primary etching step shown in FIG. 2A while a step for slantly dry-etching the insulating film 9 is used as the secondary etching step shown in FIG. 2B. The latter method involving the combination of the wet etching and the slant dry etching can obtain a more increased width of the upper portion of each contact hole finally formed. In FIGS. 3A and 3B, the reference numeral 6 denotes contact hole portions subjected to the wet etching whereas the reference numeral 7 denotes contact hole portions subjected to the slant dry etching.

As apparent from the above description, the method of the present invention can obtain contacts having various structures. In accordance with this method, the contacts obtained have a low topology, over contacts obtained in accordance with conventional methods. By virtue of such a low topology of contacts, the possibility that a deposition material reaches the lower portion of each contact is increased, thereby improving the coverage of the deposited film. It is also possible to avoid a loss of conduction layer material caused by a high contact depth for exposing the silicon substrate and conduction layers and, thus, to fabricate a highly integrated semiconductor device.

Although the preferred embodiments of the invention have been disclosed for illustrative purposes, those skilled in the art will appreciate that various additions and substitutions are possible, without departing from the scope and spirit of the invention as disclosed in the accompanying claims.

What is claimed is:

1. A method for forming contact holes in contact regions in a semiconductor device comprising the steps of:

forming a plurality of first conducting films;

depositing a first insulating film on said first conducting films;

forming a plurality of second conducting films on said first insulating film, wherein the first distance between said first conducting films is less than the second distance between said second conducting films;

depositing a second insulating film to a thickness on said second conducting films;

forming a first mask pattern on said second insulating film, wherein said first mask pattern has first contact areas which do not expose said second conducting films;

a primary etching of a portion of said second insulating film by use of said first mask pattern, such that the possibly largest area of the second insulating film is etched in so far as said second conducting films are not exposed, thereby reducing topology at an upper portion of contact regions;

removing said mask pattern;

forming a second mask pattern having second contact areas which do not expose said first conducting films and are less than those of said first contact areas, said second contact areas being located in contact regions;

a secondary etching of first and second insulating films by use of said second mask, thereby forming contact holes in the contact regions; and removing said second mask pattern.

2. A method in accordance with claim 1, wherein said secondary etching step further includes the step of annealing said first and second films prior to the step of forming said second mask pattern so as to reduce the topology of the insulating film.

3. A method in accordance with claim 1, wherein one of said second conduction films is exposed at said secondary etching step.

4. A method in accordance with claim 1, wherein both said primary etching step and said secondary etching step are carried out by use of a slant dry-etching process.

5. A method in accordance with claim 1, wherein both of said primary etching step and said secondary etching step are carried out by use of a wet-etching process.

* * * * *

UNITED STATES PATENT AND TRADEMARK OFFICE
CERTIFICATE OF CORRECTION

PATENT NO. : 5,490,901

DATED : February 13, 1996

INVENTOR(S) : Heon D. Kim

It is certified that error appears in the above-identified patent and that said Letters Patent is hereby corrected as shown below:

```
Column 4, line 35, insert --insulating-- after "second"
```

Signed and Sealed this

Ninth Day of July, 1996

Attest:

BRUCE LEHMAN

*Attesting Officer*    *Commissioner of Patents and Trademarks*